(12) United States Patent
Mohan et al.

(10) Patent No.: US 10,812,021 B2
(45) Date of Patent: Oct. 20, 2020

(54) ANTENNA WAVEGUIDE TRANSITIONS FOR SOLID STATE POWER AMPLIFIERS

(71) Applicant: Qorvo US, Inc., Greensboro, NC (US)

(72) Inventors: Ankush Mohan, Thousand Oaks, CA (US); Soack Yoon, Torrance, CA (US); Dan Denninghoff, Thousand Oaks, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/032,252

(22) Filed: Jul. 11, 2018

(65) Prior Publication Data

US 2019/0068123 A1 Feb. 28, 2019

Related U.S. Application Data

(60) Provisional application No. 62/548,447, filed on Aug. 22, 2017.

(51) Int. Cl.
*H03F 1/02* (2006.01)
*H03F 3/195* (2006.01)
(Continued)

(52) U.S. Cl.
CPC ............ *H03F 1/0205* (2013.01); *H01P 3/08* (2013.01); *H01P 5/19* (2013.01); *H01Q 13/085* (2013.01);
(Continued)

(58) Field of Classification Search
CPC ........ H03F 1/0205; H03F 3/213; H03F 3/195; H03F 2200/315; H03F 2200/255;
(Continued)

(56) References Cited

U.S. PATENT DOCUMENTS 3,023,382 A 2/1962 Borghetti
4,234,854 A 11/1980 Schellenberg et al.
(Continued)

FOREIGN PATENT DOCUMENTS

WO 2017214357 A2 12/2017

OTHER PUBLICATIONS

Author Unknown, "Interpack 2005: An assessment for PMMI members," 2005, PMMI, 32 pages.
(Continued)

*Primary Examiner* — Robert J Pascal
*Assistant Examiner* — Kimberly E Glenn
(74) *Attorney, Agent, or Firm* — Withrow & Terranova, P.L.L.C.

(57) ABSTRACT

Antenna waveguide transitions for solid state power amplifiers (SSPAs) are disclosed. An SSPA includes a waveguide channel that is configured to propagate an input signal, such as an electromagnetic signal, from an input port to a solid state amplifier for amplification. The waveguide channel is further configured to propagate an amplified signal from the solid state amplifier to an output port. Waveguide transitions to and from the solid state amplifier are bandwidth matched to the waveguide channel. Additionally, the waveguide transitions may be thermally coupled to the waveguide channel. The waveguide transitions may include antenna structures that have a signal conductor and a ground conductor. In this manner, the SSPA may have improved broadband coupling as well as improved thermal dissipation for heat generated by the solid state amplifier.

20 Claims, 8 Drawing Sheets

(51) Int. Cl.
H03F 3/213 (2006.01)
H01P 3/08 (2006.01)
H01P 5/19 (2006.01)
H01Q 13/08 (2006.01)

(52) U.S. Cl.
CPC ............. *H03F 3/195* (2013.01); *H03F 3/213* (2013.01); *H03F 2200/255* (2013.01); *H03F 2200/315* (2013.01); *H03F 2200/423* (2013.01)

(58) Field of Classification Search
CPC ........ H03F 2200/423; H01P 3/08; H01P 5/19; H01Q 13/085
USPC ....................................................... 330/307
See application file for complete search history.

(56) References Cited

U.S. PATENT DOCUMENTS

| | | |
|---|---|---|
| 4,424,496 A | 1/1984 | Nichols et al. |
| 5,036,335 A | 7/1991 | Jairam |
| 5,162,803 A | 11/1992 | Chen |
| 5,214,394 A | 5/1993 | Wong |
| 5,256,988 A | 10/1993 | Izadian |
| 5,736,908 A | 4/1998 | Alexanian et al. |
| 5,920,240 A | 7/1999 | Alexanian et al. |
| 6,028,483 A | 2/2000 | Shealy et al. |
| 6,037,840 A | 3/2000 | Myer |
| 6,181,221 B1 | 1/2001 | Kich et al. |
| 6,828,875 B2 | 12/2004 | Channabasappa et al. |
| 7,110,165 B2 | 9/2006 | Martin et al. |
| 7,215,220 B1 | 5/2007 | Jia |
| 7,466,203 B2 | 12/2008 | Rector |
| 8,698,577 B2 | 4/2014 | Sherrer et al. |
| 8,928,429 B2 | 1/2015 | Song et al. |
| 9,019,036 B2 | 4/2015 | Kolias et al. |
| 9,054,427 B2 | 6/2015 | Guy et al. |
| 9,065,163 B1 | 6/2015 | Wu et al. |
| 9,276,304 B2 | 3/2016 | Behan et al. |
| 9,287,605 B2 | 3/2016 | Daughenbaugh, Jr. et al. |
| 9,325,074 B2 | 4/2016 | Chandler |
| 9,917,343 B2 | 3/2018 | Chieh et al. |
| 9,954,706 B1 | 4/2018 | Harris et al. |
| 10,003,118 B2 | 6/2018 | Kitt |
| 10,009,067 B2 | 6/2018 | Birk et al. |
| 10,164,667 B1 | 12/2018 | Kitt |
| 2006/0202777 A1 | 9/2006 | Deckman et al. |
| 2007/0229186 A1 | 10/2007 | Hacker et al. |
| 2007/0279146 A1 | 12/2007 | Rector |
| 2014/0145794 A1 | 5/2014 | Courtney et al. |
| 2014/0167880 A1 | 6/2014 | Daughenbaugh, Jr. et al. |
| 2015/0270817 A1* | 9/2015 | Campbell ................ H03F 3/72 330/297 |
| 2017/0149113 A1 | 5/2017 | Theveneau et al. |
| 2017/0179598 A1 | 6/2017 | Kitt |
| 2018/0294539 A1 | 10/2018 | Kitt |
| 2019/0007007 A1 | 1/2019 | Kitt |
| 2019/0067778 A1 | 2/2019 | Mohan |
| 2019/0067781 A1 | 2/2019 | Mohan et al. |
| 2019/0067782 A1 | 2/2019 | Mohan et al. |
| 2019/0067783 A1 | 2/2019 | Mohan et al. |
| 2019/0067836 A1 | 2/2019 | Mohan |
| 2019/0068140 A1 | 2/2019 | Mohan et al. |
| 2019/0068141 A1 | 2/2019 | Yoon et al. |

OTHER PUBLICATIONS

Caturla, F, et al., "Electroless Plating of Graphite with Copper and Nickel," Journal of the Electrochemical Soceity, vol. 142, Issue 12, Dec. 1995, The Electrochemical Society, Inc., pp. 4084-4090.
Fitzhugh, William, et al., "Modulation of Ionic Current Limitations by Doping Graphite Anodes," Journal of Electrochemical Society, vol. 165, Issue 10, Jul. 2018, The Electrochemical Society, 6 pages.
Larkins, Grover, et al., "Evidence of Superconductivity in Doped Graphite and Graphene," Superconductor Science and Technology, vol. 29, Issue 1, Dec. 2015, IOP Publishing Ltd, 18 pages.
Glenis, S., et al., "Sulfur doped graphite prepared via arc discharge of carbon rods in the presence of thiopenes," Journal of Applied Physics, vol. 86, Issue 8, Oct. 1999, American Institute of Physics, pp. 4464-4466.
Scheike, T., et al., "Can doping graphite trigger room temperature superconductivity: Evidence for granular high-temperature superconductivity in water-treated graphite powder," Advanced Materials, vol. 24, Issue 43, Sep. 2012, 19 pages.
Smalc, Martin, et al., "Thermal Performance of Natural Graphite Heat Spreaders," Proceedings of IPACK2005, Jul. 17-22, San Francisco, California, American Society of Mechanical Engineers, 11 pages.
Notice of Allowance for U.S. Appl. No. 15/637,472, dated Mar. 12, 2019, 7 pages.
Non-Final Office Action for U.S. Appl. No. 15/846,840, dated Mar. 21, 2019, 4 pages.
Non-Final Office Action for U.S. Appl. No. 15/933,821, dated Jul. 11, 2019, 7 pages.
Non-Final Office Action for U.S. Appl. No. 15/981,516, dated Jul. 17, 2019, 5 pages.
Notice of Allowance for U.S. Appl. No. 15/845,225, dated Jan. 10, 2019, 7 pages.
Notice of Allowance for U.S. Appl. No. 16/166,548, dated Nov. 29, 2018, 8 pages.
Non-Final Office Action for U.S. Appl. No. 15/933,783, dated May 1, 2019, 8 pages.
Non-Final Office Action for U.S. Appl. No. 16/042,351, dated Jul. 5, 2019, 5 pages.
Notice of Allowance for U.S. Appl. No. 15/846,840, dated Jul. 5, 2019, 7 pages.
Non-Final Office Action for U.S. Appl. No. 15/981,535, dated Jul. 8, 2019, 5 pages.
Non-Final Office Action for U.S. Appl. No. 15/637,472, dated Aug. 10, 2018, 8 pages.
Notice of Allowance for U.S. Appl. No. 15/927,565, dated Aug. 8, 2018, 8 pages.
Author Unknown, "Spatial Combining Technology: Revolutionizing the Microwave Power Amplifier," Microwave Journal, Sep. 8, 2008, http://www.microwavejournal.com/articles/print/6838-spatial-combining, CAP Wireless Inc., 7 pages.
Author Unknown, "Vivaldi antenna," Wikipedia, web page last edited Feb. 7, 2017, accessed May 11, 2017, https://en.wikipedia.org/wiki/Vivaldi_antenna, Wikimedia Foundation, Inc., 2 pages.
Courtney, Patrick G. et al., "120 W Ka Band Power Amplifier Utilizing GaN MMICs and Coaxial Waveguide Spatial Power Combining," White Paper, May 2016, Qorvo, pp. 1-8.
Jia, Pengcheng et al., "Broadband High Power Amplifier using Spatial Power Combining Technique" IEEE Transactions on Microwave Theory and Techniques, vol. 51, Issue 12, Dec. 2003, IEEE, 4 pages.
Leggieri, Alberto et al., "The Squarax Spatial Power Combiner," Progress in Electromagnetics Research C, vol. 45, Oct. 2013, EMW Publishing, pp. 43-55.
Ortiz, Sean C., "High Power Spatial Combiners: Tile and Tray Approaches," Dissertation, North Carolina State University, Electrical Engineering, Nov. 2001, 194 pages.
Notice of Allowance for U.S. Appl. No. 15/290,749, dated Feb. 16, 2018, 9 pages.
Amjadi, S., et al., "Design of a Broadband Eight-Way Coaxial Wavelength Power Combiner," IEEE Transactions on Microwave Theory and Techniques, vol. 60, Issue 1, Nov. 15, 2011, pp. 39-45.
Beyers, R., et al., "Compact Conical-Line Power Combiner Design Using Circuit Models," IEEE Transactions on Microwave Theory and Techniques, vol. 62, Issue 11, Oct. 9, 2014, pp. 2650-2658.
Fathy, A., et al., "A Simplified Approach for Radial Power Combiners," IEEE Transactions on Microwave Theory and Techniques, vol. 54, No. 1, Jan. 2006, pp. 247-255.
Gharehkand, F., "Design of a 16 Way Radial Microwave Power Divider/Combiner with Rectangular Waveguide Output and Coaxial Inputs," International Journal of Electronics and Communications (AEU), vol. 68, 2014, pp. 422-428.

(56) References Cited

OTHER PUBLICATIONS

Tribak, A., et al., "Ultra-Broadband High Efficiency Mode Converter," Progress in Electromagnetics Research C, vol. 36, 2013, pp. 145-158.
Montgomery, R., et al., "Solid-State PAs Bathe TWTAs for ECM Systems," Microwave Journal, Jun. 2017 Supplement, Jun. 14, 2017, 3 pages.
Möttönen, V. S., "Receiver Front-End Circuits and Components for Millimetre and Submillimetre Wavelengths," Dissertation for the degree of Doctor of Science in Technology, Helsinki University of Technology, Department of Electrical and Communications Engineering, Radio Laboratory, Apr. 2005, 40 pages.
Notice of Allowance for U.S. Appl. No. 16/005,794, dated Jan. 9, 2020, 7 pages.
Notice of Allowance for U.S. Appl. No. 16/008,586, dated Feb. 4, 2020, 8 pages.
Corrected Notice of Allowance and Applicant-Initiated Interview Summary for U.S. Appl. No. 15/846,840, dated Dec. 31, 2019, 6 pages.
Notice of Allowance for U.S. Appl. No. 15/981,535, dated Dec. 31, 2019, 7 pages.
Notice of Allowance for U.S. Appl. No. 15/933,821, dated Jan. 15, 2020, 7 pages.
Non-Final Office Action for U.S. Appl. No. 16/039,435, dated Jan. 7, 2020, 5 pages.
Notice of Allowance for U.S. Appl. No. 15/981,516, dated Jan. 15, 2020, 7 pages.
Non-Final Office Action for U.S. Appl. No. 16/005,794, dated Oct. 7, 2019, 11 pages.
Notice of Allowance for U.S. Appl. No. 16/042,351, dated Nov. 18, 2019, 7 pages.
Non-Final Office Action for U.S. Appl. No. 16/008,586, dated Oct. 24, 2019, 10 pages.
Non-Final Office Action for U.S. Appl. No. 16/191,541, dated Dec. 9, 2019, 7 pages.
Corrected Notice of Allowance and Examiner-Initiated Interview Summary for U.S. Appl. No. 15/846,840, dated Dec. 12, 2019, 6 pages.
Corrected Notice of Allowability and Examiner-Initiated Interview Summary for U.S. Appl. No. 16/005,794, dated May 26, 2020, 6 pages.
Notice of Allowance for U.S. Appl. No. 16/039,435, dated Jun. 17, 2020, 8 pages.
Notice of Allowance for U.S. Appl. No. 16/214,234, dated May 15, 2020, 8 pages.
Non-Final Office Action for U.S. Appl. No. 16/288,735, dated May 26, 2020, 9 pages.
Final Office Action for U.S. Appl. No. 16/191,541, dated Mar. 31, 2020, 8 pages.
Advisory Action, Examiner-Initiated Interview Summary, and AFCP 2.0 Decision for U.S. Appl. No. 16/191,541, dated May 21, 2020, 5 pages.
Notice of Allowance for U.S. Appl. No. 16/191,541, dated Jul. 9, 2020, 7 pages.
Non-Final Office Action for U.S. Appl. No. 16/284,214, dated Aug. 20, 2020, 5 pages.

* cited by examiner

ANTENNA WAVEGUIDE TRANSITIONS FOR SOLID STATE POWER AMPLIFIERS

RELATED APPLICATION

This application claims the benefit of provisional patent application Ser. No. 62/548,447, filed Aug. 22, 2017, the disclosure of which is hereby incorporated herein by reference in its entirety.

FIELD OF THE DISCLOSURE

The disclosure relates generally to solid state power amplifiers and, more particularly, to antenna waveguide transitions for structures for solid state power amplifiers.

BACKGROUND

Traveling wave tube amplifiers (TWTAs) have historically been used to provide broadband microwave power amplification for high power commercial and defense communication applications such as radar, satellite, and electronic warfare. A typical TWTA provides amplification through the interaction of a radio frequency (RF) field and an electron beam within a vacuum tube. While TWTAs provide adequate output power necessary for high power applications, there are several drawbacks, including short lifetime, poor linearity, high cost, large size and weight, and the requirement of a high drive voltage.

In recent years, solid state power amplifier (SSPA) devices have begun to replace TWTAs for broadband microwave power amplification. SSPAs generate lower noise and have improved linearity when compared to TWTAs. Additionally, SSPAs provide superior reliability while achieving high output powers, bandwidths, and efficiencies needed for various applications. An SSPA is able to provide these operating characteristics while at the same time providing a device with a smaller overall size and weight.

In a typical SSPA, an electromagnetic signal is split across multiple amplifiers for amplification. Power combining schemes are utilized to subsequently combine outputs from the multiple amplifiers into an amplified output signal. The art continues to seek improved SSPAs that provide improved combinations of output power, bandwidth, and efficiency and are capable of overcoming challenges associated with conventional broadband power amplification devices.

SUMMARY

Aspects disclosed herein include antenna waveguide transitions for solid state power amplifiers (SSPAs). An SSPA includes a waveguide channel that is configured to propagate an input signal, such as an electromagnetic signal, from an input port to a solid state amplifier for amplification. The waveguide channel is further configured to propagate an amplified signal from the solid state amplifier to an output port. Waveguide transitions to and from the solid state amplifier may be bandwidth matched to the waveguide channel. Additionally, the waveguide transitions may be thermally coupled to the waveguide channel. The waveguide transitions may include antenna structures that have a signal conductor and a ground conductor. In this manner, the SSPA may have improved broadband coupling, as well as improved thermal dissipation for heat generated by the solid state amplifier.

In some aspects, an SSPA includes a solid state amplifier; an input port and an output port; a waveguide channel configured to propagate an input signal from the input port to the solid state amplifier and configured to propagate an amplified signal from the solid state amplifier to the output port; an input antenna structure inside the waveguide channel that is configured to transition the input signal from the waveguide channel to the solid state amplifier; and an output antenna structure inside the waveguide channel that is configured to transition the amplified signal from the solid state amplifier to the waveguide channel. In some embodiments, the input antenna structure further comprises an input signal conductor and an input ground conductor. The input signal conductor and the input ground conductor are on opposing faces of a substrate or they may be separated by air. In some embodiments, the input antenna structure and the output antenna structure are bandwidth matched to the waveguide channel. In some embodiments, at least one of the input antenna structure and the output antenna structure are thermally coupled to one or more walls of the waveguide channel. The solid state amplifier may include a monolithic microwave integrated circuit (MMIC) amplifier, such as a gallium nitride (GaN)-based MMIC.

In some aspects, an SSPA includes a plurality of solid state amplifiers; an input port and an output port; a waveguide channel connected to the input port and the output port, wherein the waveguide channel comprises: a first plurality of waveguide segments that individually connect with separate solid state amplifiers of the plurality of solid state amplifiers; and a second plurality of waveguide segments that individually connect with separate solid state amplifiers of the plurality of solid state amplifiers and combine the waveguide channel; a plurality of input antenna structures inside the first plurality of waveguide segments that are configured to transition portions of a signal propagating through the first plurality of waveguide segments to the plurality of solid state amplifiers; and a plurality of output antenna structures inside the second plurality of waveguide segments that are configured to transition portions of an amplified signal from the plurality of solid state amplifiers to the waveguide channel. In some embodiments, the plurality of solid state amplifiers comprises at least four solid state amplifiers. In some embodiments, each input antenna structure of the plurality of input antenna structures comprises an input signal conductor and an input ground conductor. In some embodiments, the input signal conductor and the input ground conductor are on opposing faces of a substrate. In other embodiments, the input signal conductor and the input ground conductor are separated by air. In some embodiments, each output antenna structure of the plurality of output antenna structures comprises an output signal conductor and an output ground conductor. The output signal conductor and the output ground conductor may be on opposing faces of a substrate or they may be separated by air. In some embodiments, at least one input antenna structure of the plurality of input antenna structures and at least one output antenna structure of the plurality of output antenna structures are thermally coupled to a wall of the waveguide channel. In some embodiments, the SSPA includes a housing that includes a plurality of housing segments that form the waveguide channel. In further embodiments, the plurality of housing segments comprises a plurality of hollow channels that form the waveguide channel.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed herein include antenna waveguide transitions for solid state power amplifiers (SSPAs). An SSPA includes a waveguide channel that is configured to propagate an input signal, such as an electromagnetic signal, from an input port to a solid state amplifier for amplification. The waveguide channel is further configured to propagate an amplified signal from the solid state amplifier to an output port. Waveguide transitions to and from the solid state amplifier may be bandwidth matched to the waveguide channel. Additionally, the waveguide transitions may be thermally coupled to the waveguide channel. The waveguide transitions may include antenna structures that have a signal conductor and a ground conductor. In this manner, the SSPA may have improved broadband coupling, as well as improved thermal dissipation for heat generated by the solid state amplifier.

In some embodiments, an SSPA includes a solid state amplifier, an input port, an output port and a waveguide channel. The waveguide channel is configured to propagate an input signal from the input port to the solid state amplifier and configured to propagate an amplified signal from the solid state amplifier to the output port. As used herein, a waveguide refers to a structure that transfers electromagnetic waves through a medium, such as a waveguide channel. Waveguide channels may include various mediums, such as coaxial lines, hollow tubes, and dielectrics, among others. In some embodiments, hollow tubes may include hollow metal conductors filled with pressurized gas to prevent arcing. In other embodiments, hollow metal conductors may be under a vacuum. Waveguide channels with hollow metal conductors may be suitable for SSPAs operating in radio frequency ranges. Electromagnetic wave propagation inside the waveguide channel is characterized according to reflections off of interior walls of the hollow metal conductors; and accordingly, the wavelength range a waveguide channel can support is related to the dimensions of the interior walls. For example, a WR28 waveguide has a recommended operating frequency bandwidth of 26.5 to 40 GHz, where WR stands for waveguide rectangular and 28 is the inner dimension width of the waveguide channel rounded to the nearest hundredths of an inch. For higher frequencies, smaller waveguides are needed. For example, a WR10 waveguide has a recommended operating frequency bandwidth of 75 to 110 GHz. In this manner, the operating bandwidth of an SSPA that utilizes a hollow waveguide channel is limited by the dimensions of the waveguide channel.

As previously described for an SSPA, the waveguide channel may be configured to propagate an electromagnetic signal to and from a solid state amplifier for amplification. In this regard, waveguide transitions are utilized to transition the electromagnetic signal to and from the solid state amplifier, where the electromagnetic signal is three-dimensional in the waveguide channel and two-dimensional in the solid state amplifier. Conventional SSPAs typically use probe launch or ridge configurations for waveguide transitions. Probe launches use a conductor suspended inside the waveguide, and ridge configurations use a conductor with a series of transition steps along a single plane. These conventional waveguide transitions are typically bandwidth limited to ranges below the capabilities of the waveguide and may additionally have power handling limitations. In some embodiments disclosed herein, a waveguide transition includes an antenna structure that is bandwidth matched to the waveguide. The antenna structure may include an antipodal antenna structure that includes a signal conductor and a ground conductor on opposing sides or separated by a medium, such as a substrate or air.

Figure 1A:
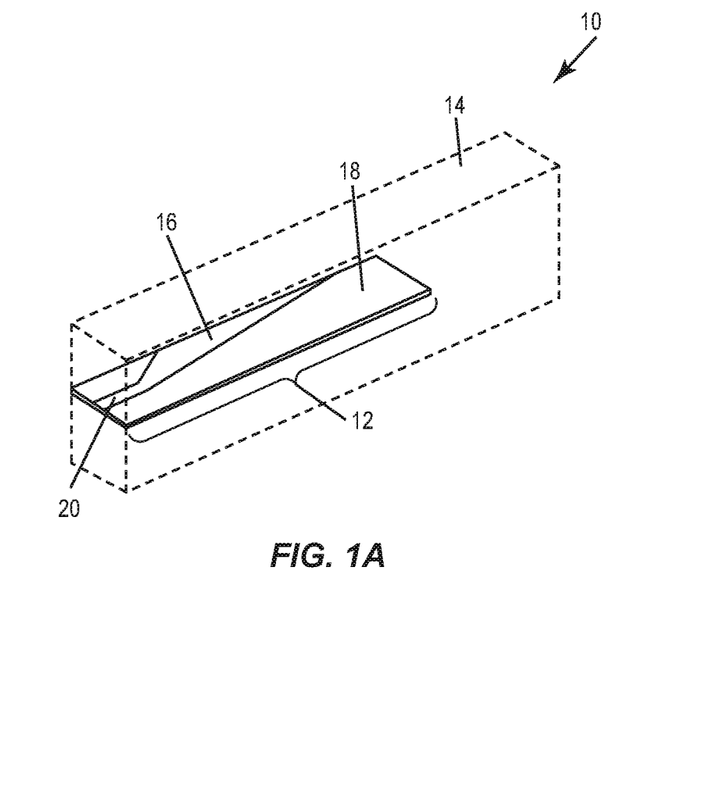
FIG. 1A is a perspective view of a waveguide transition according to some embodiments.

FIG. 1A is a perspective view of a waveguide transition 10 according to some embodiments. The waveguide transition 10 includes an antenna structure 12 located inside a waveguide channel 14. The antenna structure 12 includes a signal conductor 16 and a ground conductor (not visible) on opposing faces of a substrate 18, such as a printed circuit board. The signal conductor 16 includes a signal connector 20, such as a microstrip line that is configured to be electrically connected to an amplifier (not shown). In some embodiments, the signal connector 20 may be configured with an impedance matching value of about 50 Ohms, although other designs such as 30 Ohms are possible. In some embodiments, the signal connector 20 is configured to receive a two-dimensional electromagnetic signal and transmit it through the antenna structure 12 where it radiates between the signal conductor 16 and the ground conductor (not visible). The electromagnetic signal then transitions into a three-dimensional electromagnetic signal within the waveguide channel 14. In some embodiments, the same configuration for the waveguide transition 10 may be used for an electromagnetic signal traveling in a reverse direction. In this manner, a three-dimensional electromagnetic signal propagating within the waveguide channel 14 may be received by the antenna structure 12 where it radiates between the signal conductor 16 and the ground conductor (not visible) before it propagates to the signal conductor 16. A particular advantage of the antenna structure 12 is the ability to design or scale its dimensions such that the antenna structure 12 is bandwidth matched to the waveguide channel 14. Additionally, at least one of the signal conductor 16 and the ground conductor (not visible) may be thermally coupled to walls of the waveguide channel 14. Thermal coupling may include at least one of the signal conductor 16 and the ground conductor (not visible) directly touching walls of the waveguide channel 14. In other embodiments, at least one of the signal conductor 16 and the ground conductor (not visible) may be thermally coupled to the walls of the waveguide channel 14 by other configurations, such as thermal vias through the substrate 18. In such embodiments, at least a portion of the antenna structure 12 may be supported by the walls of the waveguide channel 14 such that a thermal via through the substrate 18 provides a thermal path. Accordingly, the thermal path is configured to dissipate heat from an amplifier through the antenna structure 12 and to the walls of the waveguide channel 14. In this regard, the antenna structure 12 is electrically shorted to the walls of the waveguide channel 14 in some embodiments, thereby providing a broadband radiating antenna structure that is also configured to more effectively dissipate heat.

Figure 1B:
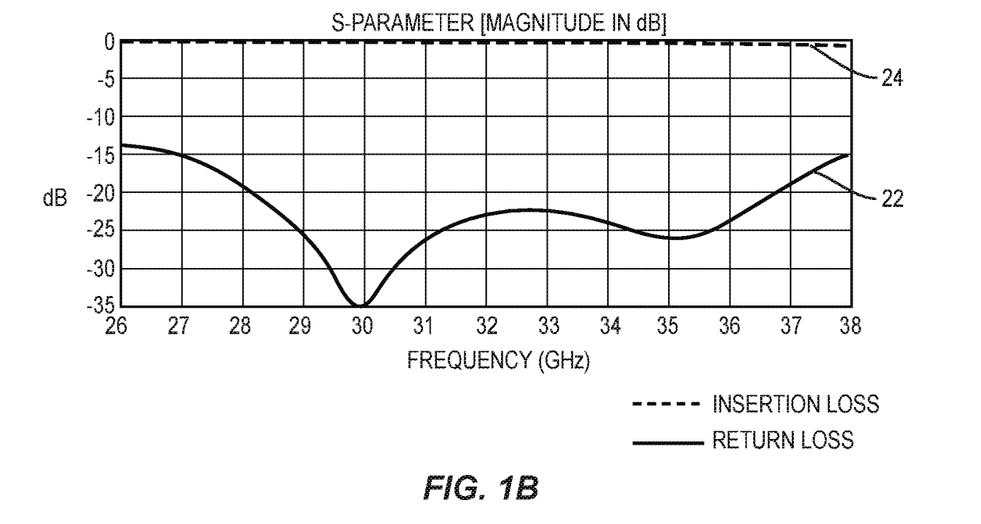
FIG. 1B is a scattering parameters (S-parameters) plot for an exemplary configuration of the waveguide transition of FIG. 1A.

FIG. 1B is a scattering parameters (S-parameters) plot for an exemplary configuration of the waveguide transition 10 of FIG. 1A. The S-parameter magnitude is plotted in decibels (dB) across a GHz frequency range. Return loss 22 is an indication of how much power is reflected from the antenna structure 12 (FIG. 1A). For frequencies where the return loss 22 is equal to 0 dB, then substantially all power from a signal is reflected. A return loss of at least −10 dB or lower is desirable for a target operating frequency range. Insertion loss 24 is an indication of how much power is transferred by the antenna structure 12 (FIG. 1A). For frequencies where the insertion loss 24 is equal to 0 dB, then substantially all power from a signal is transferred. In the exemplary configuration, the waveguide channel 14 (FIG. 1A) is configured as a WR28 waveguide with an operating frequency bandwidth of 26.5 GHz to 40 GHz. Accordingly, the antenna structure 12 (FIG. 1A) demonstrates good power transfer across a wide bandwidth of at least 26 GHz to 38 GHz. In this manner, the antenna structure 12 (FIG. 1A) may be characterized as bandwidth matched with the waveguide channel 14 (FIG. 1A).

Figure 2:
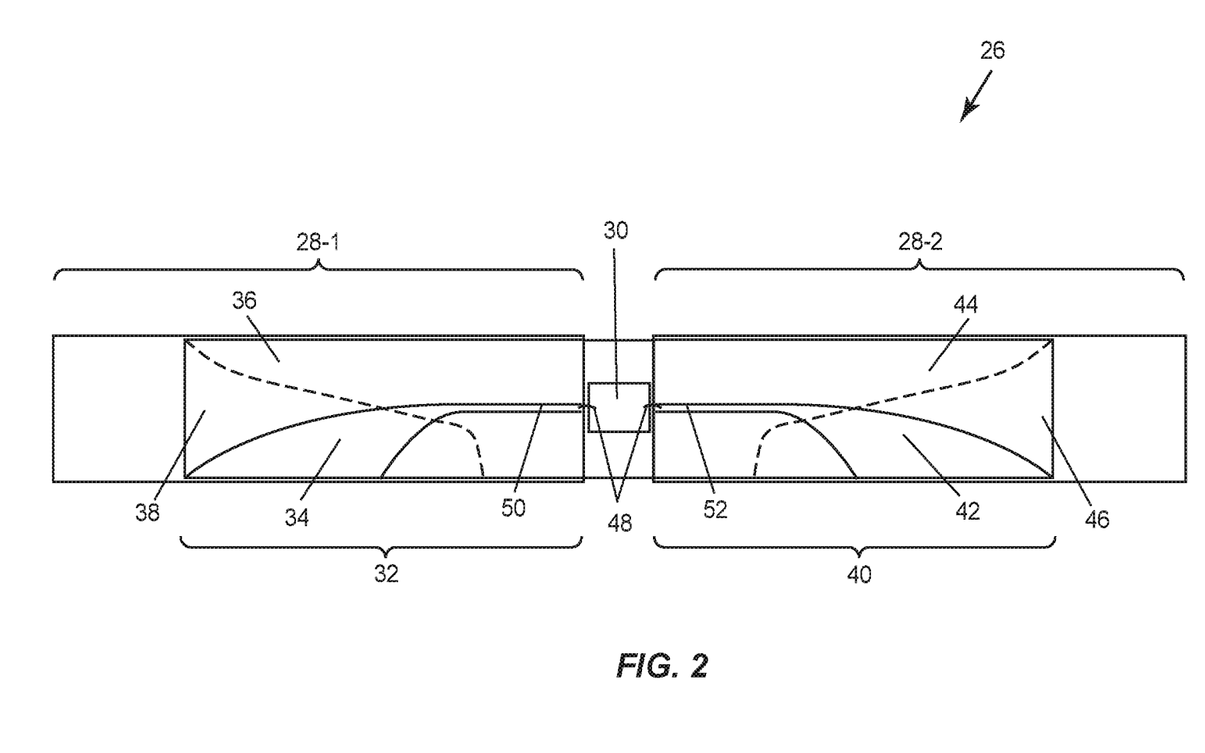
FIG. 2 is a partial cross-sectional view of input and output waveguide transitions for a representative device.

For SSPA applications according to embodiments disclosed herein, an input antenna structure may be configured as an input waveguide transition to a solid state amplifier, and an output antenna structure may be configured as an output waveguide transition from the solid state amplifier. In this regard, FIG. 2 is a partial cross-sectional view of input and output waveguide transitions for a representative device 26. The representative device 26 includes a waveguide channel 28-1, 28-2 on opposing sides of a solid state amplifier 30. In some embodiments, the solid state amplifier 30 comprises a monolithic microwave integrated circuit (MMIC) amplifier. The MMIC may be a solid-state gallium nitride (GaN)-based MMIC. A GaN MMIC device provides high power density and bandwidth, and an SSPA device may combine power from a plurality of GaN MMICs efficiently in a single step to minimize combining loss. An input antenna structure 32 is configured inside the waveguide channel 28-1 on one side of the solid state amplifier 30. The input antenna structure 32 includes an input signal conductor 34 and an input ground conductor 36 on opposing faces of a substrate 38. The input ground conductor 36 is illustrated in dashed lines to indicate it is on a face of the substrate 38 that opposes the input signal conductor 34. An output antenna structure 40 is configured inside the waveguide channel 28-2 on an opposite side of the solid state amplifier 30 as the input antenna structure 32. The output antenna structure 40 includes an output signal conductor 42 and an output ground conductor 44 on opposing faces of a substrate 46. The output ground conductor 44 is illustrated in dashed lines to indicate it is on a face of the substrate 46 that opposes the output signal conductor 42. Electrical connections 48, such as wirebonds, electrically connect the solid state amplifier 30 with an input signal connector 50 of the input signal conductor 34 and an output signal connector 52 of the output signal conductor 42. In some embodiments, at least one of the input antenna structure 32 and the output antenna structure 40 are thermally coupled to one or more walls of the waveguide channel 28-1, 28-2.

In operation, an electromagnetic signal propagating through the waveguide channel 28-1 is received by the input antenna structure 32 where it radiates between the input signal conductor 34 and the input ground conductor 36. The signal travels along the input antenna structure 32 as the input signal conductor 34 and the input ground conductor 36 taper toward each other. The input signal connector 50 transmits the signal via the electrical connection 48 to the solid state amplifier 30. The solid state amplifier 30 outputs an amplified signal to the output signal connector 52 via the electrical connection 48. The amplified signal radiates between the output signal conductor 42 and the output ground conductor 44 and travels along the output antenna structure 40 as the output signal conductor 42 and the output ground conductor 44 taper away from each other. The amplified signal is then transitioned to the waveguide channel 28-2.

In some embodiments, an SSPA is configured to deliver an electromagnetic signal to one or more amplifiers for amplification. When more than one amplifier is used, power combining schemes are configured to subsequently combine outputs from the multiple amplifiers into an amplified output signal.

Figure 3A:
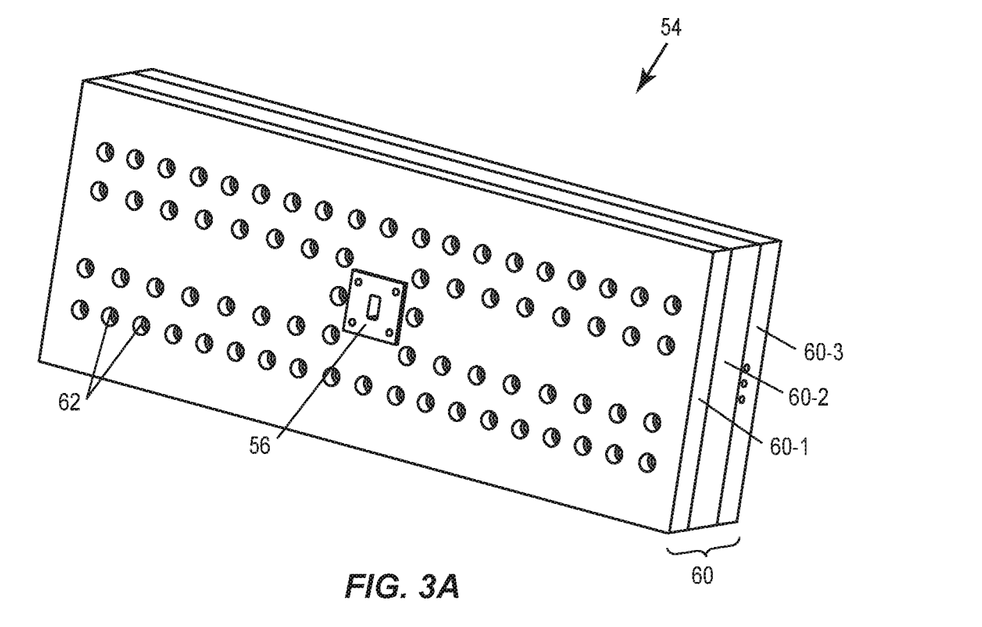
FIG. 3A is perspective view of an input side of a representative solid state power amplifier (SSPA).
Figure 3B:
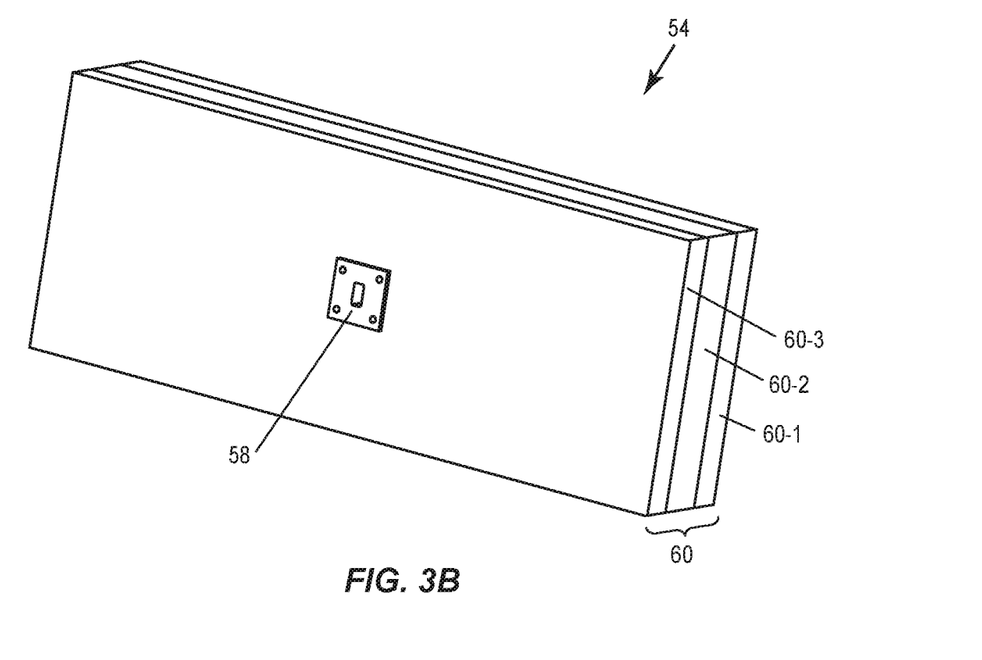
FIG. 3B is a perspective view of an output side of the representative SSPA of FIG. 3A.

FIG. 3A is perspective view of an input side of a representative SSPA 54, and FIG. 3B is a perspective view of an output side of the representative SSPA 54 of FIG. 3A. An input port 56 is visible in FIG. 3A and an output port 58 is visible in FIG. 3B. The input port 56 and the output port 58 may include any type of waveguide to waveguide connector. In other embodiments, the input port 56 and the output port 58 may include any type of coaxial to waveguide connector. The SSPA 54 further includes a housing 60. In some embodiments, the housing 60 may include a plurality of housing segments 60-1 to 60-3 that collectively form the housing 60. The housing 60 and the housing segments 60-1 to 60-3 may include a metal such as aluminum or alloys thereof, or copper or alloys thereof. The plurality of housing segments 60-1 to 60-3 may be mechanically fastened to one another. For example, the housing segment 60-1 may be screwed to the housing segment 60-2 via screw holes 62. In a similar manner, the housing segment 60-3 may also be mechanically fastened to the housing segment 60-2 with screws. Other techniques may be used to mechanically fasten the plurality of housing segments 60-1 to 60-3 to one another, including, but not limited to, bolts and nuts, clamps, rivets, and press-fit connections.

Figure 4:
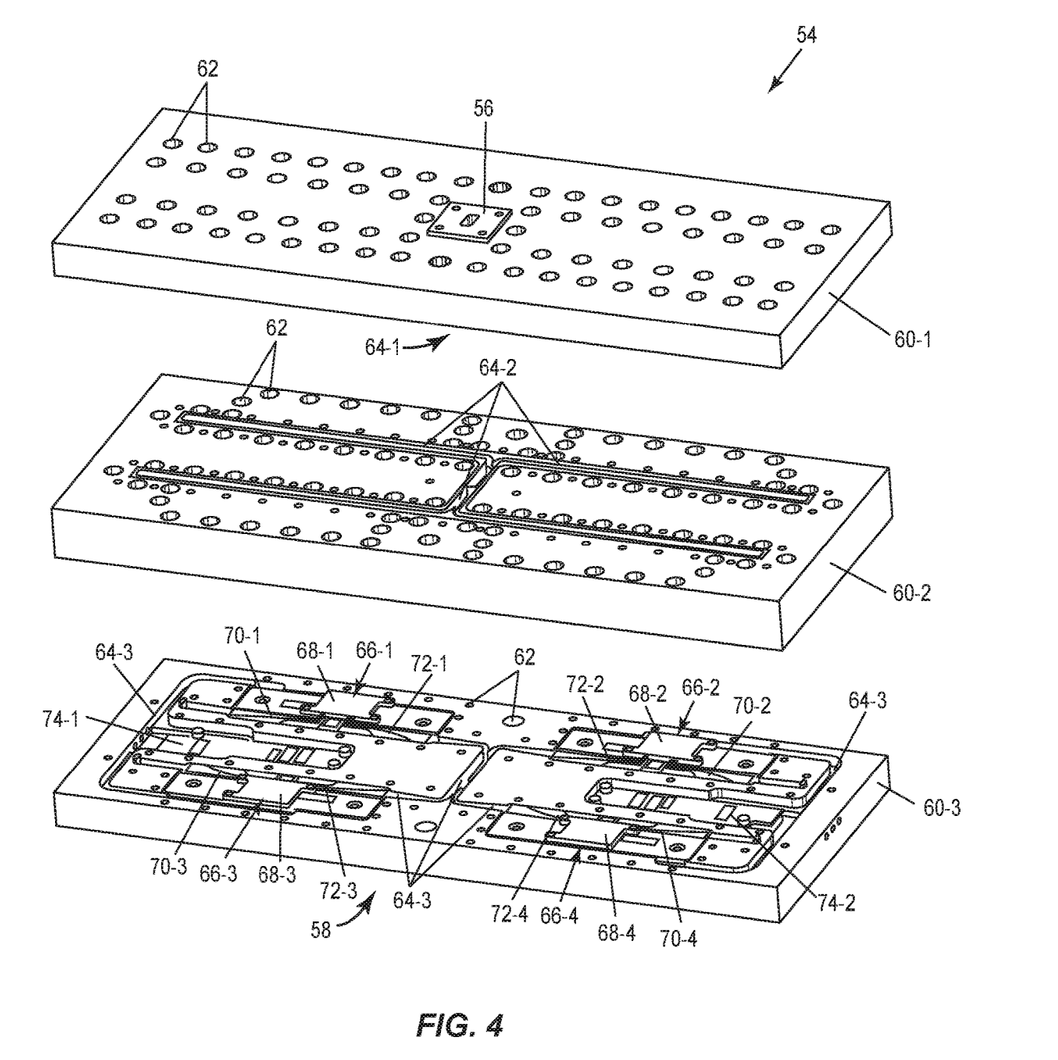
FIG. 4 is an exploded perspective view of the SSPA of FIGS. 3A and 3B.

FIG. 4 is an exploded perspective view of the SSPA 54 of FIGS. 3A and 3B. The screw holes 62 are present on each of the housing segments 60-1 to 60-3 for mechanically fastening the housing segments 60-1 to 60-3 to one another. The housing segments 60-1 to 60-3 include a plurality of hollow channels 64-1 to 64-3. The hollow channels 64-1 of the housing segment 60-1 (not visible) are connected to the input port 56, and the hollow channels 64-3 of the housing segment 60-3 are connected to the output port 58 (FIG. 3B). The hollow channels 64-2 of the housing segment 60-2 are aligned with both the hollow channels 64-1 and 64-3. When the housing segments 60-1 to 60-3 are assembled together, the hollow channels 64-1 to 64-3 collectively form a waveguide channel that connects the input port 56 to the output port 58 (FIG. 3B). The waveguide channel formed by the hollow channels 64-1 to 64-3 is additionally connected with a plurality of solid state amplifiers 66-1 to 66-4. In this regard, a separate portion of the waveguide channel is routed separately to each of the solid state amplifiers 66-1 to 66-4. In FIG. 4, the plurality of solid state amplifiers 66-1 to 66-4 are covered by amplifier covers 68-1 to 68-4. A plurality of input antenna structures 70-1 to 70-4 and a plurality of output antenna structures 72-1 to 72-4 as previously described are arranged in the waveguide channel on opposing sides of the plurality of solid state amplifiers 66-1 to 66-4. In some embodiments, at least one of the input antenna structures 70-1 to 70-4 and the output antenna structures 72-1 to 72-4 are thermally coupled to one or more walls of the waveguide channel formed by the hollow channels 64-1 to 64-3. In this regard, at least one of the input antenna structures 70-1 to 70-4 and the output antenna structures 72-1 to 72-4 are thermally coupled to a portion of the housing 60 (e.g. at least one of housing segments 60-2 and 60-3). The housing segment 60-3 further includes bias boards 74-1 and 74-2 that are configured to provide drive power to the plurality of solid state amplifiers 66-1 to 66-4.

While the SSPA 54 of FIG. 4 is illustrated with four solid state amplifiers 66-1 to 66-4, it is understood that SSPAs as described herein may have different numbers of solid state amplifiers. For example, an SSPA may be configured to power combine from six solid state amplifiers, or eight solid state amplifiers, or sixteen solid state amplifiers. In some embodiments, a separate waveguide segment of a waveguide channel is routed to each individual amplifier. For example, an SSPA with eight solid state amplifiers may include a waveguide configured to divide into eight different corresponding waveguide segments. In other embodiments, two or more solid state amplifiers may be associated with a particular waveguide segment. For example, circuitry may be present to deliver an electromagnetic signal from a single waveguide segment to two solid state amplifiers. In this regard, an SSPA with eight solid state amplifiers may include a waveguide configured to divide into less than eight, or four, different corresponding waveguide segments.

Accordingly, in some embodiments disclosed herein, an SSPA may comprise a solid state amplifier; an input port and an output port; and a waveguide channel configured to propagate an input signal from the input port to the solid state amplifier and configured to propagate an amplified signal from the solid state amplifier to the output port. The SSPA may further comprise an input antenna structure inside the waveguide channel that is configured to transition the input signal from the waveguide channel to the solid state amplifier; and an output antenna structure inside the waveguide channel that is configured to transition the amplified signal from the solid state amplifier to the waveguide channel.

In other embodiments disclosed herein, an SSPA may comprise a plurality of solid state amplifiers; an input port and an output port; a waveguide channel connected to the input port and the output port, wherein the waveguide channel comprises: a first plurality of waveguide segments that individually connect with separate solid state amplifiers of the plurality of solid state amplifiers; and a second plurality of waveguide segments that individually connect with separate solid state amplifiers of the plurality of solid state amplifiers and combine the waveguide channel. The SSPA may further comprise a plurality of input antenna structures inside the first plurality of waveguide segments that are configured to transition portions of a signal propagating through the first plurality of waveguide segments to the plurality of solid state amplifiers; and a plurality of output antenna structures inside the second plurality of waveguide segments that are configured to transition portions of an amplified signal from the plurality of solid state amplifiers to the waveguide channel.

Figure 5:
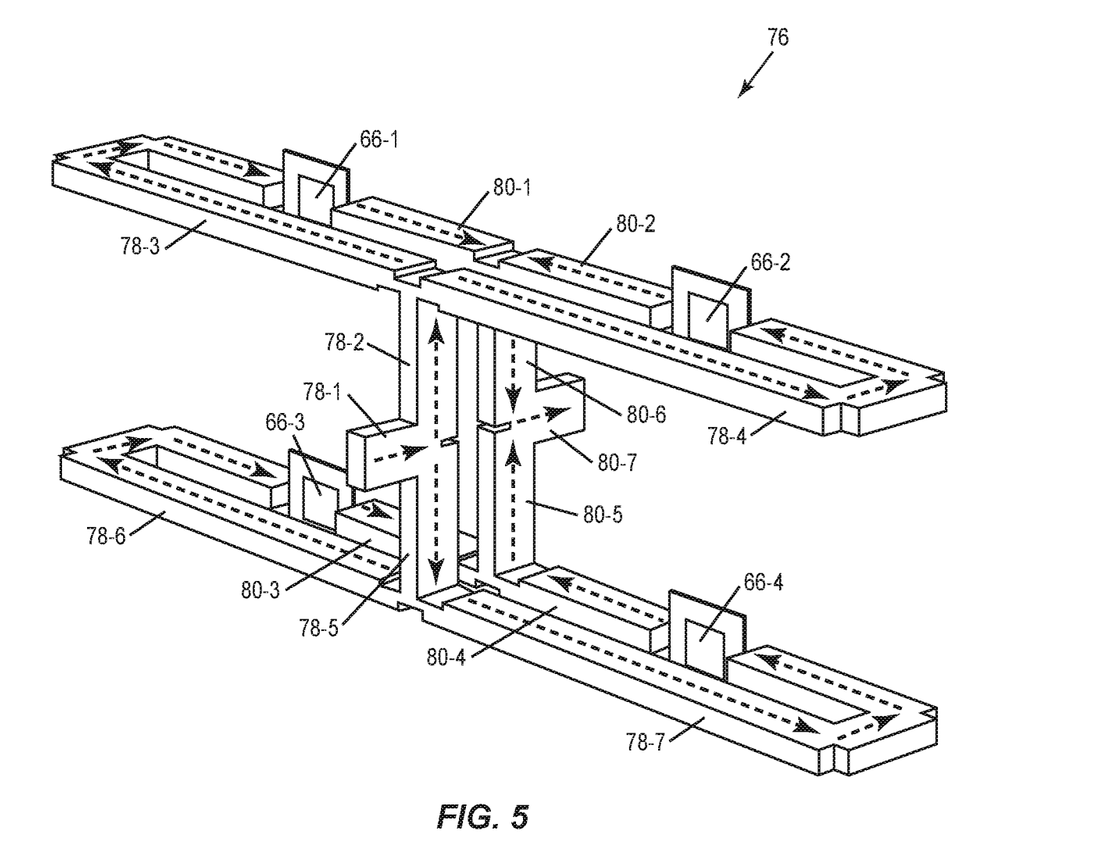
FIG. 5 is a perspective view of a waveguide channel that is formed when the hollow channels of FIG. 4 are joined together.

FIG. 5 is a perspective view of a waveguide channel 76 that is formed when the hollow channels 64-1 to 64-3 of FIG. 4 are joined together. The waveguide channel 76 includes a first plurality of waveguide segments 78-1 to 78-7 that are configured to divide the waveguide channel 76 from the input port 56 (FIG. 4) and individually connect with separate solid state amplifiers 66-1 to 66-4 of the plurality of solid state amplifiers 66-1 to 66-4. The waveguide channel 76 further includes a second plurality of waveguide segments 80-1 to 80-7 that individually connect with the plurality of solid state amplifiers 66-1 to 66-4 and combine the waveguide channel 76 before connecting with the output port 58 (FIG. 3A). In operation, the waveguide segment 78-1 receives an electromagnetic signal from the input port 56 (FIG. 4). The electromagnetic signal is divided along the waveguide segments 78-2 to 78-7 to the plurality of solid state amplifiers 66-1 to 66-4. Each of the solid state amplifiers 66-1 to 66-4 transmits a portion of an amplified signal to be combined along the waveguide segments 80-1 to 80-7 before transmitting the amplified signal through the waveguide segment 80-7 to the output port 58 (FIG. 3A). A signal path through the waveguide channel 76 is illustrated by dashed-lines with arrows indicating the propagation direction.

Embodiments disclosed herein are scalable for a wide range of operating frequencies. An input antenna structure and an output antenna structure as previously described enable form factors compact enough to provide high performance power combining at millimeter (mm) wave frequencies. Different operating frequency ranges are achievable by scaling the input antenna structure and the output antenna structure to different sizes that correspond with differently sized waveguides. For example, embodiments disclosed herein are suitable for waveguide and waveguide channel configurations including WR28 with an operating frequency band of 26.5 GHz to 40 GHz; WR10 with an operating frequency band of 75 GHz to 110 GHz; WR8 with an operating frequency band of 90 GHZ to 140 GHz; and WR3 with an operating frequency of 220 GHz to 330 GHz.

Figure 6A:
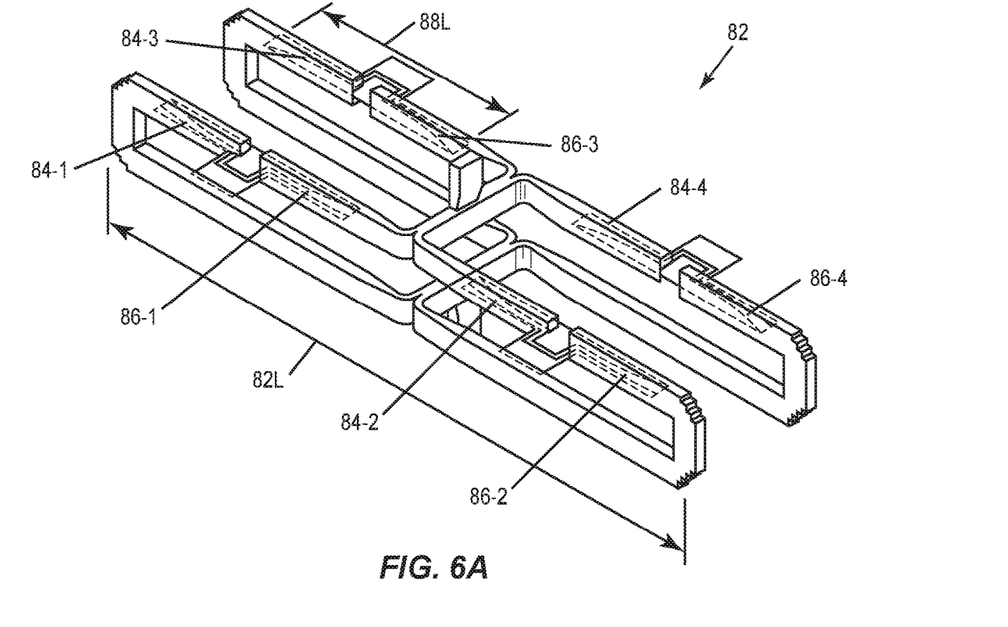
FIG. 6A is a perspective view of a model of a waveguide channel for a four-way WR28 SSPA.
Figure 6B:
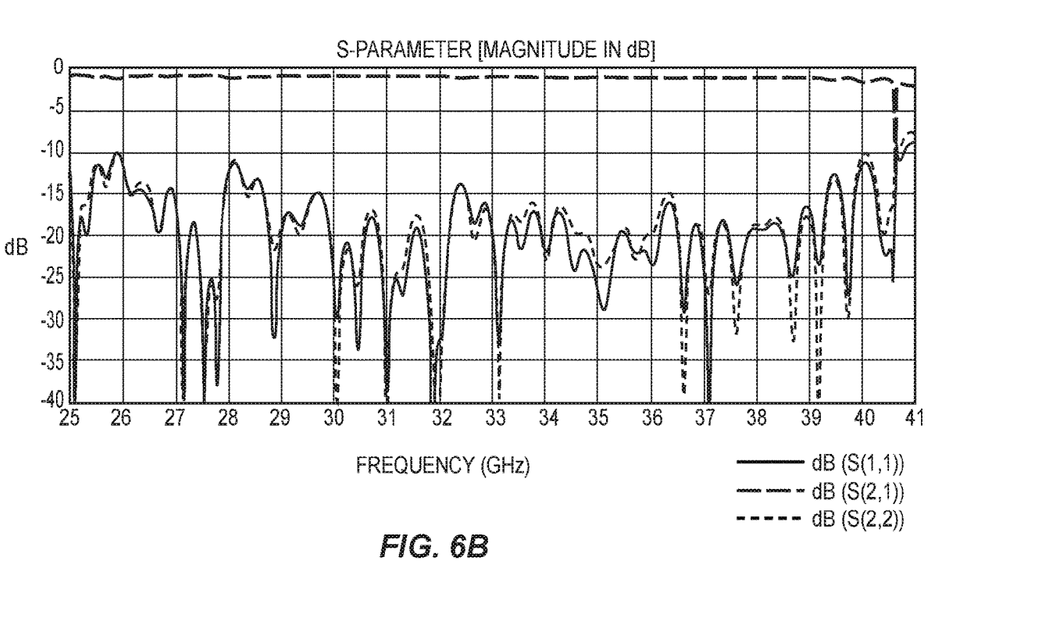
FIG. 6B is an S-parameters plot for the four-way WR28 SSPA model and waveguide channel of FIG. 6A.

FIG. 6A is a perspective view of a model of a waveguide channel 82 for a four-way WR28 SSPA. Four input antenna structures 84-1 to 84-4 and four output antenna structures 86-1 to 86-4 are configured in different areas along the waveguide channel 82. In some embodiments, an overall length 82L of the waveguide channel 82 is in a range of 6 to 7 inches, and a corresponding length 88L of a single pair of an input antenna structure (e.g., one of 84-1 to 84-4) and an output antenna structure (e.g., a corresponding one of 86-1 to 86-4) is in a range of 2 to 3 inches. In FIG. 6A, the length 88L is illustrated for the pair of the input antenna structure 84-3 and the output antenna structure 86-3. It is understood that the other antenna pairs would have a similar length. FIG. 6B is an S-parameters plot for the four-way WR28 SSPA model and waveguide channel 82 of FIG. 6A. The S-parameter magnitude is plotted in dB across a GHz frequency range. Return loss, or S1,1 and S2,2, is an indication of how much power is reflected. For frequencies where S1,1 and S2,2 is equal to 0 dB, then substantially all power from a signal is reflected. A return loss of at least −10 dB or lower is desirable for a target operating frequency range. Insertion loss, or S2,1, is an indication of how much power is transferred. For frequencies where S2,1 is equal to 0 dB, then substantially all power from a signal is transferred. Accordingly, the four-way WR28 SSPA demonstrates good power transfer across the WR28 operating bandwidth of 26.5 GHz to 40 GHz.

Figure 7A:
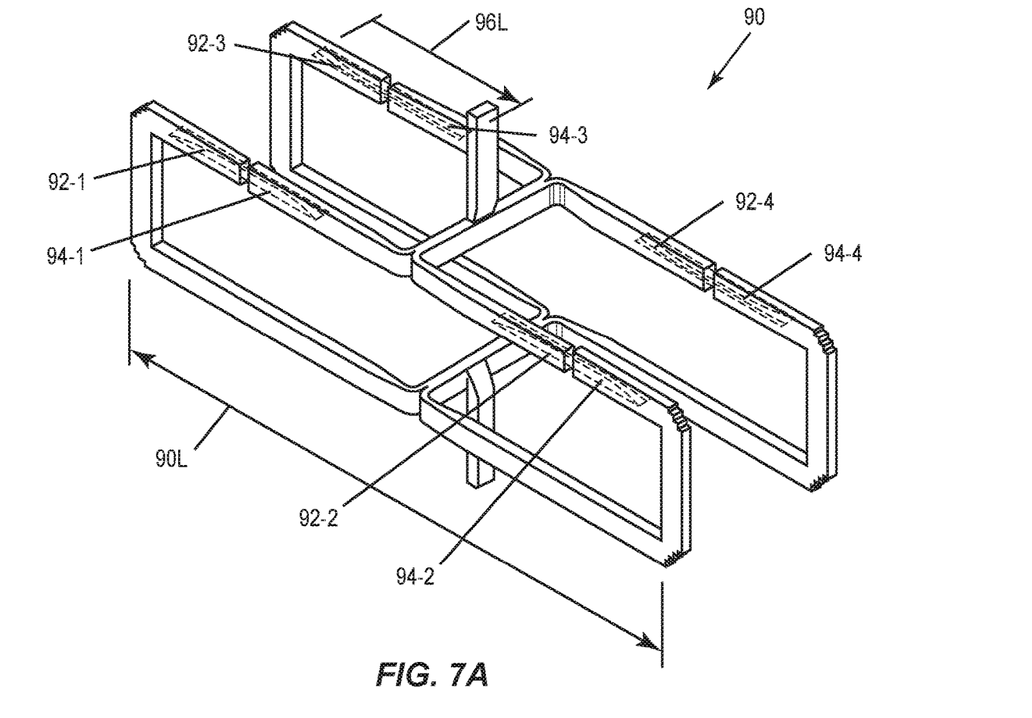
FIG. 7A is a perspective view of a model of a waveguide channel for a four-way WR10 SSPA.
Figure 7B:
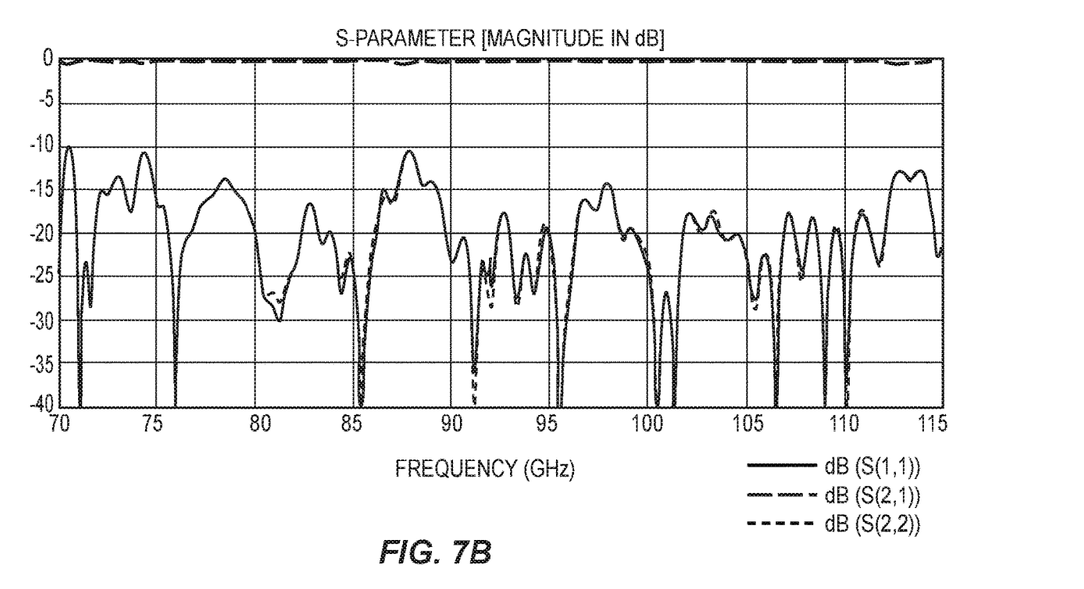
FIG. 7B is an S-parameters plot for the four-way WR10 SSPA model and waveguide channel of FIG. 7A.

FIG. 7A is a perspective view of a model of a waveguide channel 90 for a four-way WR10 SSPA. As previously described, the operating bandwidth for WR10 configurations includes higher frequencies than a WR28 configuration, and the waveguide width for the WR10 configuration is accordingly smaller. Four input antenna structures 92-1 to 92-4 and four output antenna structures 94-1 to 94-4 are configured in different areas along the waveguide channel 90. In some embodiments, an overall length 90L of the waveguide channel 90 is in a range of 2.5 to 3.5 inches, and a corresponding length 96L of a single pair of an input antenna structure (e.g., one of 92-1 to 92-4) and an output antenna structure (e.g., a corresponding one of 94-1 to 94-4) is in a range of 0.5 to 1 inch. In FIG. 7A, the length 96L is illustrated for the pair of the input antenna structure 92-3 and the output antenna structure 94-3. It is understood that the other antenna pairs would have a similar length. Notably, in some embodiments the length 90L of the waveguide channel 90 for the WR10 SSPA is less than about 40% of the length 82L of the waveguide channel 82 for the WR28 SSPA of FIG. 6A. Additionally, the length 96L of the antenna pair (92-3 and 94-3) for the WR10 SSPA is less than about 35% of the length 88L for the antenna pair (84-3 and 86-3) for the WR28 SSPA of FIG. 6A. FIG. 7B is an S-parameters plot for the four-way WR10 SSPA and waveguide channel 90 of FIG. 7A. The S-parameter magnitude is plotted in dB across a GHz frequency range. The return loss, or S1,1 and S2,2, is an indication of how much power is reflected. For frequencies where S1,1 and S2,2 is equal to 0 dB, then substantially all power from a signal is reflected. A return loss of at least −10 dB or lower is desirable for a target operating frequency range. The insertion loss, or S2,1, is an indication of how much power is transferred. For frequencies where S2,1 is equal to 0 dB, then substantially all power from a signal is transferred. Accordingly, the four-way WR10 SSPA demonstrates good power transfer across the WR10 operating bandwidth of 75 GHz to 110 GHz.

Antenna structures as described herein may be configured in a variety of antenna form factors. In some embodiments, an antenna structure may include a signal conductor and a ground conductor on opposing faces of a substrate. The substrate may include a printed circuit board, quartz, woven fiberglass, and other laminate materials. The signal conductor and ground conductor may taper away from each other in a variety of profiles such as a continuous taper, a stepped taper, and an asymmetric taper. In that regard, the antenna structures may be configured as any of a finline, stepped, or Vivaldi antenna. In some embodiments, an antenna structure includes a signal conductor and a ground conductor that are thick enough to not require a substrate for support. In this manner, the signal conductor and the ground conductor may be separated by air.

Figure 8A:
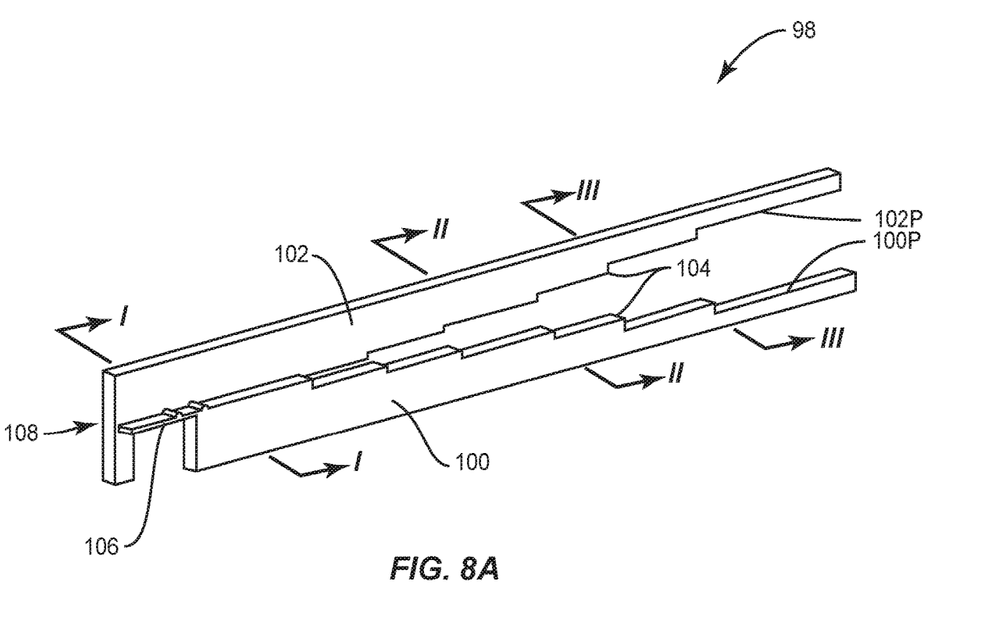
FIG. 8A is a perspective view of an antenna structure according to some embodiments.

FIG. 8A is a perspective view of an antenna structure 98 according to some embodiments. The antenna structure 98 includes a signal conductor 100 with a first profile 100P and a ground conductor 102 with a second profile 102P that diverge away from each other along parallel planes in a lengthwise direction. The signal conductor 100 and the ground conductor 102 may additionally include tuning features 104 configured for a desired operating frequency and an operating bandwidth. In FIG. 8A, the tuning features 104 are configured in a continuously decreasing stepwise manner as the signal conductor 100 and the ground conductor 102 diverge away from each other. Accordingly, the first profile 100P and the second profile 102P may diverge from one another in a stepwise manner. However, many different profiles are possible depending on the desired frequency and bandwidth operation. For example, the tuning features 104 may comprise steps that increase and decrease at various points along the first profile 100P and the second profile 102P. Additionally, the first profile 100P and the second profile 102P may diverge from one another in a continuous manner without steps.

As in previous embodiments, the signal conductor 100 may additionally include a signal connector 106 for transmitting or receiving a signal to or from an amplifier. The connector 106 may be a single piece or integral with the signal conductor 100, or it may be formed separately. The connector 106 is a transition area for the antenna structure 98 to transmit or receive a signal, such as a signal with frequency in the microwave range or higher. The antenna structure 98 may comprise a metal with a thickness such that a substrate is not required for support, thereby an air gap 108 is maintained entirely between the signal conductor 100 and the ground conductor 102. Accordingly, the signal conductor 100 and the ground conductor 102 are entirely separated by air.

Figure 8B:
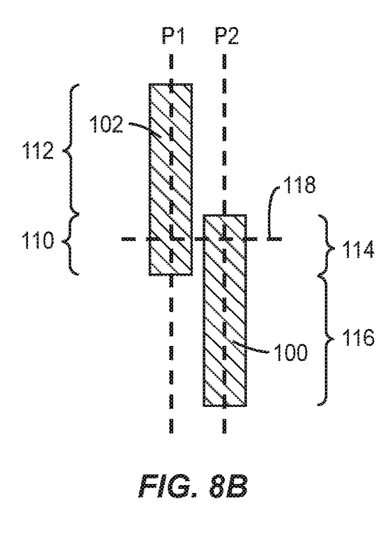
FIG. 8B represents a cross-section taken along section line I-I of the antenna structure of FIG. 8A.
Figure 8C:
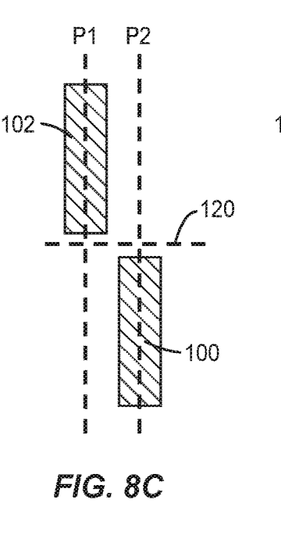
FIG. 8C represents a cross-section taken along section line II-II of the antenna structure of FIG. 8A.
Figure 8D:
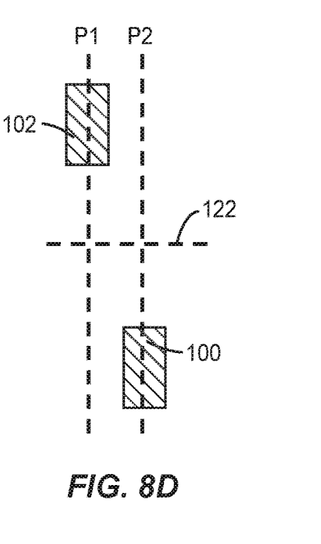
FIG. 8D represents a cross-section taken along section line III-III of the antenna structure of FIG. 8A.

FIGS. 8B, 8C, and 8D represent various cross-sections taken along section lines I-I, II-II, and III-III, respectively, of the antenna structure 98 of FIG. 8A in which the ground conductor 100 and the signal conductor 102 diverge away from each other along a lengthwise direction. As shown, the ground conductor 102 is a planar structure positioned in a first plane P1, and the signal conductor 100 is a planar structure positioned in a second plane P2, and the first plane P1 is parallel to the second plane P2. The ground conductor 102 comprises a ground conductor overlapping portion 110 and a ground conductor non-overlapping portion 112. The signal conductor 100 comprises a signal conductor overlapping portion 114 and a signal conductor non-overlapping portion 116. In FIG. 8B, a first line 118 perpendicular to the first plane P1 intersects the ground conductor overlapping portion 110 and the signal conductor overlapping portion 114. As the ground conductor 102 and the signal conductor 100 diverge away from each other along the lengthwise direction of the antenna structure, there are cross-sections where no line perpendicular to the first plane P1 intersects any portion of both the ground conductor 102 and the signal conductor 100. For example, in the cross-sections of FIGS. 8C and 8D, a second line 120 and a third line 122, respectively, represent perpendicular lines closest to both the ground conductor 102 and the signal conductor 100.

It is understood that the antenna structure 98 of FIGS. 8A to 8D may be configured to comprise an input antenna structure or an output antenna structure as described in previous embodiments. Accordingly, the ground conductor 102 may be configured as an input ground conductor with an input ground conductor overlapping portion and an input ground conductor non-overlapping portion or an output ground conductor with an output ground conductor overlapping portion and an output ground conductor non-overlapping portion. The signal conductor 100 may be configured as an input signal conductor with an input signal conductor overlapping portion and an input signal conductor non-overlapping portion or an output signal conductor with an output signal conductor overlapping portion and an output signal conductor non-overlapping portion.

Those skilled in the art will recognize improvements and modifications to the preferred embodiments of the present disclosure. All such improvements and modifications are considered within the scope of the concepts disclosed herein and the claims that follow.

What is claimed is:

1. A solid state power amplifier (S SPA) comprising:
a solid state amplifier;
an input port and an output port;
a waveguide channel configured to propagate an input signal from the input port to the solid state amplifier and configured to propagate an amplified signal from the solid state amplifier to the output port, wherein the waveguide channel forms a hollow waveguide;
an input antenna structure inside the waveguide channel that is configured to transition the input signal from the waveguide channel to the solid state amplifier; and
an output antenna structure inside the waveguide channel that is configured to transition the amplified signal from the solid state amplifier to the waveguide channel.

2. The SSPA of claim 1 wherein the input antenna structure further comprises an input signal conductor and an input ground conductor.

3. The SSPA of claim 2 wherein the input signal conductor and the input ground conductor are on opposing faces of a substrate.

4. The SSPA of claim 3 wherein the input signal conductor and the input ground conductor are separated by air.

5. The SSPA of claim 4 wherein the input antenna structure and the output antenna structure are bandwidth matched to the waveguide channel.

6. The SSPA of claim 1 wherein at least one of the input antenna structure and the output antenna structure are thermally coupled to one or more walls of the waveguide channel.

7. The SSPA of claim 1 wherein the solid state amplifier comprises a monolithic microwave integrated circuit (MMIC) amplifier.

8. The SSPA of claim 7 wherein the MMIC amplifier comprises a gallium nitride (GaN)-based MMIC.

9. A solid state power amplifier (SSPA) comprising:
a plurality of solid state amplifiers;
an input port and an output port;
a waveguide channel connected to the input port and the output port, wherein the waveguide channel comprises:
a first plurality of waveguide segments that individually connect with separate solid state amplifiers of the plurality of solid state amplifiers; and
a second plurality of waveguide segments that individually connect with separate solid state amplifiers of the plurality of solid state amplifiers and combine the waveguide channel;
a plurality of input antenna structures inside the first plurality of waveguide segments that are configured to transition portions of a signal propagating through the first plurality of waveguide segments to the plurality of solid state amplifiers; and a plurality of output antenna structures inside the second plurality of waveguide segments that are configured to transition portions of an amplified signal from the plurality of solid state amplifiers to the waveguide channel.

10. The SSPA of claim 9 wherein the plurality of solid state amplifiers comprises at least four solid state amplifiers.

11. The SSPA of claim 9 wherein each input antenna structure of the plurality of input antenna structures comprises an input signal conductor and an input ground conductor.

12. The SSPA of claim 11 wherein the input signal conductor and the input ground conductor are on opposing faces of a substrate.

13. The SSPA of claim 11 wherein the input signal conductor and the input ground conductor are separated by air.

14. The SSPA of claim 9 wherein each output antenna structure of the plurality of output antenna structures comprises an output signal conductor and an output ground conductor.

15. The SSPA of claim 14 wherein the output signal conductor and the output ground conductor are on opposing faces of a substrate.

16. The SSPA of claim 14 wherein the output signal conductor and the output ground conductor are separated by air.

17. The SSPA of claim 9 wherein at least one input antenna structure of the plurality of input antenna structures and at least one output antenna structure of the plurality of output antenna structures are thermally coupled to a wall of the waveguide channel.

18. The SSPA of claim 9 further comprising a housing that includes a plurality of housing segments that form the waveguide channel.

19. The SSPA of claim 18 wherein the plurality of housing segments comprises a plurality of hollow channels that form the waveguide channel.

20. The SSPA of claim 9 wherein the plurality of solid state amplifiers comprises a plurality of monolithic microwave integrated circuit (MMIC) amplifiers.

* * * * *